(12) United States Patent
Bammer et al.

(10) Patent No.: US 7,408,345 B2
(45) Date of Patent: Aug. 5, 2008

(54) GENERALIZED MRI RECONSTRUCTION WITH CORRECTION FOR MULTIPLE IMAGE DISTORTION

(75) Inventors: Roland Bammer, Palo Alto, CA (US); Chunlei Liu, Fremont, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/348,852

(22) Filed: Feb. 6, 2006

(65) Prior Publication Data

US 2007/0182411 A1 Aug. 9, 2007

(51) Int. Cl.
*G01V 3/00* (2006.01)
(52) U.S. Cl. ..................... 324/307; 324/309
(58) Field of Classification Search .......... 324/309, 324/307, 306, 314, 318; 600/407–422
See application file for complete search history.

(56) References Cited

U.S. PATENT DOCUMENTS

| | | | | |
|---|---|---|---|---|
| 6,853,191 | B1 * | 2/2005 | Miller et al. | 324/309 |
| 2007/0182411 | A1 * | 8/2007 | Bammer et al. | 324/307 |

OTHER PUBLICATIONS

Rasche et al, "Resampling of Data Between Arbitrary Grids Using Convolution Interpolation," IEEE Transactions On Medical Imaging, vol. 18, No. 5, May 1999.

Pruessmann et al., "*Advances in Sensitivity Encoding With Arbitrary k-Space Trajectories*," Magnetic Resonance in Medicine 46:638-651 (2001).

Jackson et al., "*Selection of a Convolution Function for Fourier Inversion Using Gridding*," IEEE Trans. Med. Imaging, 1991; 10:473-478.

Bammer et al., "*Analysis and Generalized Correction of the Effect of Spatial Gradient Field Distortions in Diffusion-Weighted Imaging*," Magnetic Resonance in Medicine 50:560-569 (2003).

* cited by examiner

*Primary Examiner*—Brij Shrivastav
*Assistant Examiner*—Tiffany A Fetzner
(74) *Attorney, Agent, or Firm*—Beyer Law Group LLP

(57) ABSTRACT

Disclosed is an effective algorithm to correct motion-induced phase error using an iterative reconstruction. Using a conjugate-gradient (CG) algorithm, the phase error is treated as an image encoding function. Given the complex perturbation terms, diffusion-weighted images can be reconstructed using an augmented sensitivity map. The mathematical formulation and image reconstruction procedures are similar to the SENSE reconstruction. By defining a dynamic composition sensitivity, the CG phase correction method can be conveniently incorporated with SENSE reconstruction for the application of multi-shot SENSE DWI. Effective phase correction and multi-shot SENSE DWI (R=1 to 3) are demonstrated on both simulated and in vivo data acquired with PROPELLER and SNAILS.

18 Claims, 7 Drawing Sheets

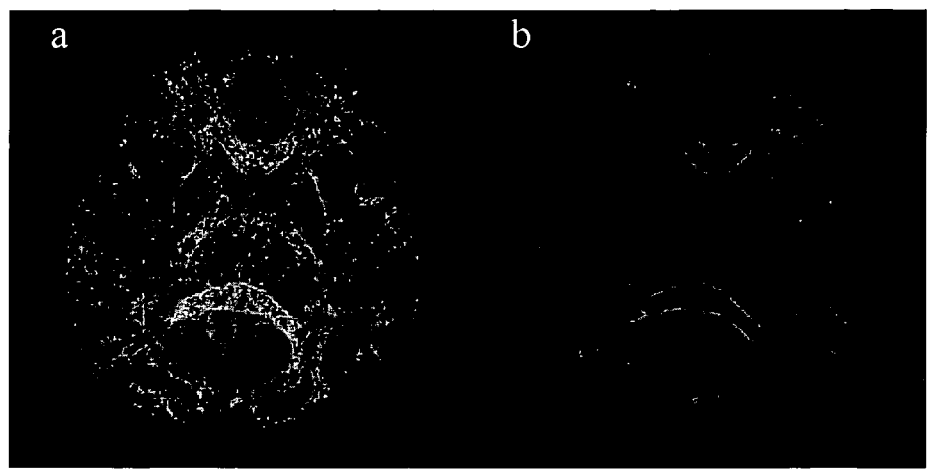
FIG. 3
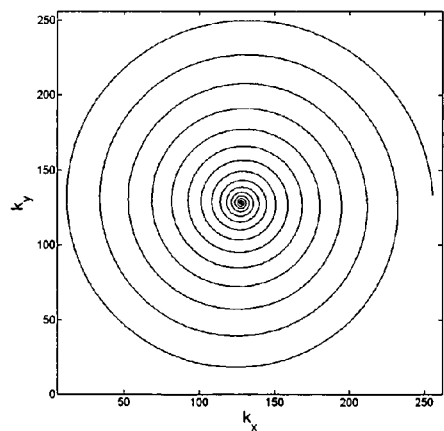 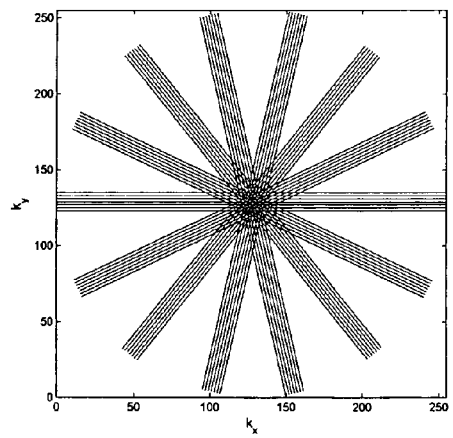
FIG. 4a            FIG. 4b

GENERALIZED MRI RECONSTRUCTION WITH CORRECTION FOR MULTIPLE IMAGE DISTORTION

The U.S. government has rights in the claimed invention pursuant to NIH Grant No. 1R01EB002711 to Stanford University.

BACKGROUND OF THE INVENTION

This invention relates generally to multi-dimensional magnetic resonance imaging (MRI), and more particularly the invention relates to MRI reconstruction in the presence of multiple image signal distortions.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

MRI signals for reconstructing an image of an object are obtained by placing the object in a magnetic field, applying magnetic gradients for slice selection, applying a magnetic excitation pulse to tilt nuclei spins in the desired slice, and then detecting MRI signals emitted from the tilted nuclei spins while applying readout gradients. The detected signals can be envisioned as traversing lines in a Fourier transformed space (k-space) with the lines aligned and spaced parallel in Cartesian trajectories or emanating from the origin of k-space in spiral trajectories.

Self-navigated interleaved spirals (SNAILS) have been used for high resolution diffusion weighted imaging (DWI). Although spiral trajectories have many advantages for fast image acquisition, they normally suffer from image blurring caused by off-resonant spins. Many techniques have been developed for off-resonance correction. However, few studies have been reported for off resonance correction for multi-shot DWI. One difficulty in this situation originates from the k-space data distortion caused by motion-induced phase errors.

Diffusion-weighted imaging (DWI) provides a unique tissue contrast by sensitizing random molecular thermal motion using magnetic field gradients. Because of its ability to quantify this random motion, DWI has become a powerful tool for studying tissue micro-structures and detecting acute ischemic stroke in which diffusion is highly restricted very early after the onset of stroke.

Patient motion during diffusion encoding results in additional phase terms that lead to severe ghosting artifacts if not accounted for. To avoid such artifacts, diffusion-weighted images are therefore most commonly acquired using single-shot echo planar imaging (EPI) sequences. The drawbacks of single-shot EPI include relatively low image resolution limited by $T_2^*$ decay and geometric distortions caused by magnetic field inhomogeneity. One technique to overcome the aforementioned distortions is combining sensitivity encoding (SENSE) with single-shot EPI. Alternatively, several multi-shot sequences, for example PROPELLER and SNAILS (self-navigated interleaved spiral), have been shown to be capable of acquiring high resolution (up to 512×512) diffusion-weighted images with significantly diminished distortions.

One common problem inherent to multi-shot diffusion-weighted image acquisition is image-domain phase perturbation that varies from shot to shot, which has thus far limited the application of parallel imaging to multi-shot DWI. This phase variation can be either linear or non-linear. The linear phase variation is usually caused by rigid-body motion during diffusion encoding periods; whereas the non-linear phase can be caused by nonrigid motion, for example by brain pulsation. Correcting this phase variation by subtracting a low resolution phase map from each shot has proven efficient. The phase map can be obtained either from an extra navigator image or from the k-space data of a self-navigated trajectory (e.g. variable density spirals). This simple phase correction algorithm can remove effectively the phase error to a certain degree which has been applied in both PROPELLER and SNAILS DWI. This algorithm was thought to be adequate, provided that each shot samples the k-space above the Nyquist rate. PROPELLER DWI is one technique that satisfies this sampling criterion. More specifically, in PROPELLER DWI, during each shot a selected segment of the k-space is sampled at the Nyquist rate. Data acquired from each shot results in a unaliased, but blurred, image, which permits a straight-forward phase subtraction.

Although successful image reconstruction has been demonstrated with PROPELLER DWI, the phase variation cannot be completely corrected by the direct subtraction algorithm due to image blurring or aliasing. For PROPELLER DWI, because the phase error is usually smooth, the residual artifact might not be so severe. For arbitrary, undersampled k-space trajectories, however, the incomplete phase correction worsens considerably because of possible aliasing artifacts. For example, when each shot undersamples some portions of the k-space, the effect of aliasing causes the phase error at one location to appear at other locations. The resulting non-localized phase error can no longer be corrected through a simple phase subtraction. Therefore, images reconstructed using this simple phase subtraction algorithm may still suffer from severe motion-induced artifacts and residual ghosts may have to be suppressed using multiple averages.

The present invention is directed to a generalized iterative image reconstruction which simultaneously corrects for multiple signal distortions including phase, off resonance and gradient non-linearities.

SUMMARY OF THE INVENTION

The present invention acquires two- and three-dimensional magnetic resonance signals and performs a generalized iterative image reconstruction including correction of phase, off resonance, and gradient non-linearities.

In a preferred embodiment, the invention utilizes an iterative conjugate gradient approach but is applicable to eventual faster algorithms for matrix inversion, or solving the entire reconstruction problem by means of Calculus of Variation (Total Variation). Moreover, due to the nature of the iterative reconstruction, no a priori knowledge of the sampling density for retrospective correction is necessary. While prior art can suffer from strong geometric distortions and blurring or ghosting errors, this invention is unique since it corrects for all these distortions simultaneously.

Although not limited to, the method capitalizes on variable-density spiral acquisitions from which navigator phase and complex coil sensitivity information can be acquired. Alternatively, this information can be obtained from additional navigator echoes and calibration scans addressed in prior art. Off-resonance phase information can be obtained by slightly shifting the echo time between two acquisitions, also addressed in prior art.

The invention permits correction of all of these distortions simultaneously by incorporating the perturbations directly into a design matrix of the image reconstruction formalism.

The invention and objects and features thereof will be more readily apparent from the following description and appended claims when taken with the drawings.

BRIEF DESCRIPTION OF THE DRAWINGS

FIG. 3 illustrates computed fraction anisotropy (FA) map.

FIGS. 4a, 4b illustrate SNAILS and PROPELLER trajectories.

DETAILED DESCRIPTION OF THE PREFERRED EMBODIMENTS

Figure 1:
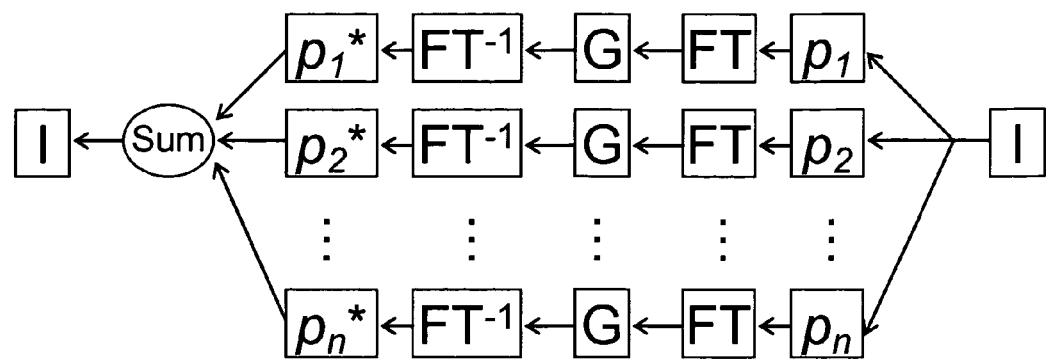
FIG. 1 illustrates algorithm flow chart for conjugate gradient (CG) iteration as employed in a preferred embodiment of the invention.

Consider first the conventional, generalized discrete notation for MRI data acquisition for an arbitrary k-space sampling pattern.

The signal formation in k-space for a multi-coil MR experiment with an arbitrary k-space trajectory can be written for the $\gamma^{th}$-coil as:

$$m(k_l) = \sum_{\rho=1}^{N*N} s_\gamma(r_\rho) v(r_\rho) e^{-jk_l r_\rho} \qquad (1)$$

or more explicitly written for the $\gamma^{th}$-coil as:

$$\begin{pmatrix} m_\gamma(k_0) \\ m_\gamma(k_1) \\ \vdots \\ m_\gamma(k_k) \end{pmatrix} = \begin{pmatrix} s_\gamma(r_0)e^{-jk_0 r_0} & s_\gamma(r_1)e^{-jk_0 r_1} & \dots & s_\gamma(r_{N^2})e^{-jk_0 r_{N^2}} \\ s_\gamma(r_0)e^{-jk_1 r_0} & s_\gamma(r_1)e^{-jk_1 r_1} & \dots & s_\gamma(r_{N^2})e^{-jk_1 r_{N^2}} \\ \vdots & \vdots & \ddots & \vdots \\ s_\gamma(r_0)e^{-jk_K r_0} & s_\gamma(r_1)e^{-jk_K r_1} & \dots & s_\gamma(r_{N^2})e^{-jk_K r_{N^2}} \end{pmatrix} \begin{pmatrix} v(r_0) \\ v(r_1) \\ \vdots \\ v(r_{N^2}) \end{pmatrix} \qquad (2)$$

$$= m_\gamma$$
$$= E_\gamma v$$

$$v = (E^H E)^{-1} E^H m$$

Here, the vectors $m = [m_0\ m_1\ \dots\ m_{nc}]^T$ and v are of lenth1 nk*nc and N*N, respectively (nk denotes the total number of k-space sampling points, nc denotes the total number of receiving coils, and N denotes the number of points along each dimension of the image), and consequently the matrix $E = [E_0\ E_1 \dots E_{nc}]^T$ and $(E^H E)$ must be of size nk*nc×N*N and N*N×N*N, respectively. This is basically the discrete Fourier Transform in matrix notation modulated by the complex coil sensitivity s(r) that—applying the principle of reciprocity— each voxel r sees. Notice that the image signal is stored in vector form v. The vector indices in Equation 2 are suggesting a 2-dimensional reconstruction. However, due to the vector notion this problem can be easily extended to 3-dimensions. Increased reconstruction time should not be our current concern for the proof of concept. The only requirement to solve Equation 2 is nk*nc≧$N^2$. In a typical spiral imaging experiment this condition is generally fulfilled given that every 4 us a data point is generated and the trajectory design fulfills the Nyquist sampling criterion. As long as this problem is sufficiently conditioned and not underdermined, an image can be reconstructed without knowledge of the degree of undersampling. This reconstruction is also applicable for sufficiently sampled single-coil images without knowledge of the coil sensitivity in practical applications, the DFTs will be replaced by (gridding and FFT/IFFT (Fast Fourier Transform and Inverse Fast Fourier Transform) and ultimately by convolutions.

For N>128, clearly this inverse problem is excessively large for direct computation and other methods should be considered. By observing that m=Ev minimizes the quadratic form[1]

$$f = 0.5 v^T E v - m^T v + c \qquad (3)$$

the generalized SENSE (GSENSE) reconstruction problem can be seen as finding the solution vector v such that the quadratic form has its minimum. The simplest way of finding this solution would be to iteratively follow the steeliest gradient of f. Unfortunately, this method converges very slowly if E is poorly conditioned and an unfortunate starting location is chosen. A very effective method to solve the (generalized SENSE reconstruction problem is the conjugate gradient (CG) method[1]:

1. reformulate the reconstruction problem into:

$$(E^H E) v = E^H m \qquad (4)$$

2. precompute $E^H m$ once (gridding).
3. initialize $v^{(0)}$ with zeroes.
4. solve for v iteratively by computing $(E^H E) v^{(n)}$, where n indicates the iteration step.

The expression $(E^H E) v^{(n)}$ can be effectively solved by two gridding operations, where $k = E v^{(n)}$ is an inverse gridding operation[2]: i.e., (i) perform roll-off correction, (ii) zero-pad $v^{(n)}$ and inverse FFT, (iii) convolve with Kaiser-Bessel window and resample k-space data along the prescribed k-space trajectory. Likewise, the $(E^H E) v^{(n)} = E^H k$ is a conventional gridding operation: i.e., (i) convolve k-space trajectory data with Kaiser-Bessel window and resample on a 2× grid, (ii) FFT to image domain and trim image matrix, (iii) perform roll-off correction.[3] A nice feature of this two-step process is that the matrix E is not required to be precomputed or stored. Moreover, utilizing the FFT reduces the computational complexity of each step from $N^4$ to $N^2 \log N$ operations.

The only difference from the classical gridding operation proposed by Jackson el al. is the missing sampling density correction. However, this can be accounted for by introducing a diagonal matrix D ($D_{(\gamma,K),(\gamma,K)} = k\_density(k_K)^{-1}$) into the reconstruction problem $(E^H D E) v^{(n)} = E^H D k$. This step leads to a much faster convergence of the CG algorithm. To further improve convergence, an image intensity correction should be performed for the right-hand side of Eq. 4. The right-hand side expression of Eq. 4 is weighted by the sum-of-squares of the coil sensitivities and should thus be corrected by using the root-mean-square of the intensity weighting factor $$C_{\rho,\rho} = 1/\sqrt{|s_\gamma(r_\rho)|^2}. \qquad (5)$$

However, left-multiplication of the left-hand side of Eq. 4 means there is no longer a guarantee of positive definiteness (i.e., $v^T E v > 0$ for all $v \neq 0$) and, therefore, both a left-multiplication with C and the introduction of the identity matrix $CC^{-1}$ is performed, which still improves convergence of the conjugate gradient method:

$$(CE^H D E C)(C^{-1} v) = CE^H D m. \qquad (6)$$

Here, the right-hand side expression represents the gridded, density- and intensity-corrected undersampled image. An intensity modulated image ($C^{-1}v$) rather than v will be evaluated during each iteration step.

Since virtual receiver channels without mutual correlation can by generated from the true channels by means of Cholesky decomposition, in the following, the noise statistics should be neglected, and the generalized SENSE reconstruction problem can be expressed as $$E^H E x = E^H m. \qquad (7)$$

As already discussed, this problem can be solved effectively by means of the conjugate gradient algorithm. The right-hand side of this equation needs to be evaluated only once, whereas the left-hand side will be iterated until the estimate $x^{(n)}$ converges to the true solution. In the original GSENSE reconstruction $E^H E x^{(n)}$ is evaluated in two steps as $E^H(E x^{(n)})$, which can be effectively accomplished by forward and inverse gridding operations. These two gridding steps heavily determine the calculation time during each iteration and Wajer et al. showed that a reorganization of this expression can dramatically accelerate the reconstruction time. By examining the components of the matrix product $E^H E$, it becomes immediately evident that its elements are:

$$[E^H E]_{\rho,\rho'} = \sum_{\gamma=1}^{nc} s_\gamma^*(r_\rho) \left( \sum_{k=1}^{nk} e^{-jk_k \cdot (r_\rho - r_{\rho'})} \right) s_\gamma(r_{\rho'}) \qquad (8)$$

$$= \sum_{\gamma=1}^{nc} s_\gamma^*(r_\rho) Q(r_\rho - r_{\rho'}) s_\gamma(r_{\rho'}) \text{ with}$$

$$Q(r) = \sum_{k=1}^{nk} e^{-jk_k r_\rho}. \qquad (9)$$

The expression for Q(r) can be precomputed together with $E^H m$ prior to starting the conjugate gradient iterations. The only difference is that the size of Q is twice as large as $x^{(n)}$ since the argument of Q(r), $r_\rho - r_{\rho'}$, has twice the range of $r_\rho$. For a particular voxel position $r_\rho$, the elements of $E^H E x^{(n)}$ can then be evaluated by a discrete convolution of Q with ($s_\gamma x^{(n)}$)

$$[E^H E x^{(n)}]_\rho = \sum_{\gamma=1}^{nc} s_\gamma^*(r_\rho) \left( \sum_{\rho'=1}^{N^2} Q(r_\rho - r_{\rho'}) s_\gamma(r_{\rho'}) x_{\rho'}^{(n)} \right) s_\gamma(r_\rho) \qquad (10)$$

$$= \sum_{\gamma=1}^{nc} s_\gamma^*(r_\rho) [Q * (s_\gamma(r_{\rho'}) x_{\rho'}^{(n)})]_\rho$$

and can be efficiently solved using fast fourier transform (FFT), i.e.

$$[Q^* = (s_\gamma(r_{\rho'}) x_{\rho'}^{(n)})] = IFFT\{FFT[Q] \cdot FFT[s_\gamma(r_{\rho'}) x_{\rho'}^{(n)}]\}. \qquad (11)$$

By storing FFT[Q] instead of Q only two FFTs are required, which have the size of Q and require $s_\gamma(r_{\rho'}) x_{\rho'}^{(n)}$ to be zero-padded prior to each iteration step. After this convolution the result has to be multiplied by the complex conjugate of the coil sensitivity $s_\gamma(r_\rho)$... and summed over all nc coils. The net increase in computational speed results from replacing the forward and inverse gridding interpolation[2] by a coil-wise multiplication in k-space with FFT[Q], which is much faster than the gridding operations. Finally, the k-space density correction[2] can be implemented without any further problems by a slight modification of $$Q(r_\rho) = \sum_{k=1}^{nk} D_{k,k} e^{-jk_k \cdot r_\rho}. \qquad (12)$$

The algorithm described above was implemented in IDL (Interactive Data Language) on 2.0 GHz Pentium4 notebook and serves as framework for our GSENSE reconstruction. For a single-shot spiral acquisition (128×128 matrix size, 2× grid, 6-element array) the precomputation for $E^H m$ and Q took 3.48 s and 2.58 s, respectively. Each conjugate gradient iteration step took 0.95 s. Likewise, for a single-shot spiral (256× 256 matrix size, 2× grid, 6-element array) the precomputation for $E^H m$ and Q took 13.97 s and 10.68 s, respectively. Each conjugate gradient iteration step took 8.55 s. With the same method, the convergence for different degrees of SENSE reduction of a single-shot spiral (128×128 matrix size, 2× grid) was analyzed.

Equation 1 can be modified so that the measured magnetization considers time invariant phase perturbations as Such from motion during diffusion and time-varianit phase perturbations as such from off resonant spins. First, we will include time invariant phase errors. Typically, such phase errors are phase perturbations in the image domain.

i) Time Invariant Phase:

Hence, modifying Eq. 1 will lead to:

$$m(k_l) = \sum_{\rho=1}^{N*N} s_\gamma(r_\rho) p(r_\rho) v(r_\rho) e^{-jk_l r_\rho}, \qquad (13)$$

where p($r_\rho$) is the time invariant phase perturbation (for example for diffusion) at the particular voxel of interest. This perturbation can be easily incorporated into the existing iterative reconstruction by means of an augmented sensitivity that includes the perturbation phase in addition to the coil specific B1 phase, i.e.

$$\tilde{s}_\gamma(r_\rho) = s_\gamma(r_\rho) p(r_\rho) \qquad (14)$$

and replaces the original sensitivity information.

ii) Time Variant Phase:

Another modification Eq. 1 will consider time variant phase due to off resonant spins. Given that the spatial distribution of off resonance is known and considering that k is linear in time Eq. 1 can be rewritten as $$m(k_{l(i\Delta t)}) = \sum_{\rho=1}^{N*N} s_\gamma(r_\rho)o(r_\rho(i\Delta t))v(r_\rho)e^{-jk_l r_\rho}, \quad (15)$$

where $o(r_\rho(i\Delta t))$ is the time variant phase perturbation due to off-resonant spins at the particular voxel of interest, e.g.

$$o(r_\rho)(i\Delta t)) = \exp(j2\pi\Delta f(i\Delta t)) \quad (16)$$

This perturbation can be easily incorporated into the existing iterative reconstruction by means of an augmented sensitivity that includes the perturbation phase in addition to the modifications made in Eq. 14, i.e.

$$\tilde{s}_\gamma(r_\rho(i\Delta t)) = s_\gamma(r_\rho)p(r_\rho)o(r_\rho(i\Delta t)). \quad (17)$$

Since all elements of matrix E have to computed anyway it is no penalty to have s time varying, i.e.

$$\begin{pmatrix} m_\gamma(k_0(i\Delta)) \\ m_\gamma(k_1(i\Delta)) \\ \vdots \\ m_\gamma(k_K(i\Delta)) \end{pmatrix} = \begin{pmatrix} s_\gamma(r_0(i\Delta))e^{-jk_0 r_0} & s_\gamma(r_1(i\Delta))e^{-jk_0 r_1} & \cdots & s_\gamma(r_{N2}(i\Delta))e^{-jk_0 r_{N2}} \\ s_\gamma(r_0(i\Delta))e^{-jk_1 r_0} & s_\gamma(r_1(i\Delta))e^{-jk_1 r_1} & \cdots & s_\gamma(r_{N2}(i\Delta))e^{-jk_1 r_{N2}} \\ \vdots & \vdots & \ddots & \vdots \\ s_\gamma(r_0(i\Delta))e^{-jk_K r_0} & s_\gamma(r_1(i\Delta))e^{-jk_K r_1} & \cdots & s_\gamma(r_{N2}(i\Delta))e^{-jk_K r_{N2}} \end{pmatrix} \quad (18)$$

$$\begin{pmatrix} v(r_0) \\ v(r_1) \\ \vdots \\ v(r_{N2}) \end{pmatrix}$$

$$= m_\gamma$$

$$= E_\gamma v$$

Providing that the gradient non-uniformity for each of the gradient coils is known at each point within the prescribed scanning slab, the actual k-vector can be expressed as $$k'(r, t) = \gamma \int_0^t L(r)G(\tau)d\tau = L(r)\gamma \int_0^t G(\tau)d\tau = L(r)k(t) \quad (19)$$

Here, the vector $G(t) = [G_x(t)G_y(t)G_z(t)]^T$ is the desired (spatially uniform) gradient waveform. If the relative deviations from the desired field are known, a spatially varying gradient coil tensor $L(r)$ can be used to relate the actual gradient produced by the coil to the desired gradient. The elements of the gradient coil tensor contain the spatially varying error terms for each of the principal gradient axes, where the actual gradient, $G_{act}$, and the desired gradient, G, are related by:

$$G_{act}(r) = \begin{pmatrix} L_{xx}(r) & L_{xy}(r) & L_{xz}(r) \\ L_{yx}(r) & L_{yy}(r) & L_{yz}(r) \\ L_{zx}(r) & L_{zy}(r) & L_{zz}(r) \end{pmatrix} G = L(r)G, \quad (20)$$

where $L(r)$ is the gradient coil tensor. In equation 20, matrix element $L_{ij}(i,j=x,y,z)$ represents the i-component of the magnetic field gradient when a unit gradient in direction j is intended. The $L_{ij}$ can be calculated from the partial derivatives of the effective spatially dependent field normalized by the applied nominal gradient strength $G_i$ $$\lambda_{ji} = \left(\frac{\partial B_z^i(r)}{\partial j}\right)\Big/ G_i \text{ with } ij = x, y, \text{ and } z. \quad (21)$$

Here, the spatial dependence of the field $B_z^i(r)$ generated by each gradient coil (i=x, y, or z coil) can be generally expressed as a spherical harmonic expansion[8]

$$B_z^{i=x,y,z}(r) = \sum_{k=0}^\infty \sum_{l=0}^k \alpha_{kl}^i H_{kl}^C(r) + \beta_{kl}^i H_{kl}^S(r) = G \cdot r + E(r), \quad (22)$$

where $H_{kl}^C(r)$ and $H_{kl}^S(r)$ are the solid spherical harmonic basis functions and $\alpha_{kl}^i$ and $\beta_{kl}^i$ are the corresponding coefficients that are specific to the MRI system. Equation 3 clearly indicates that the actual magnetic field produced by a gradient coil consists of the sum of the intended uniform field gradient (G·r) and extra terms of higher order (E(r)). Note that the extra terms always include gradients orthogonal to the desired gradient direction.

Using the gradient calibration settings specific for an individual MR unit provided by the manufacturer, the spatial distribution of the individual gradient error functions can be calculated for each slice and used for retrospective correction of image warping and diffusion maps. To this end, equation 21 can be evaluated either numerically or analytically. Since in this formulation $r=[x\ y\ z]^T$ is the true location, the geometric distortions in the images have to be unwarped first before the diffusion-encoding correction can be applied. However, the gradient non-uniformity causes an RF pulse to excite spins that are not within a flat plane, which is also known as 'potato chipping'. A complete correction would therefore require determining the displacement of each voxel from the desired slice and to calculate the gradient coil tensor at the correct location z' on the 'potato-chipped' slice. This can be done with multi-slice or 3D data. An alternative approach which is not used here is to define the basis functions in terms of fully warped coordinates. However, the present generalized correction method can employ any other method that accurately models the spatial field distribution $B_z(r)$ generated by the gradient coils.

To consider gradient non-linearity in the iterative reconstruction k has simply replaced by the augmented k', i.e. the encoding the voxel truly "sees".

$$\begin{pmatrix} m_\gamma(k_0(i\Delta)) \\ m_\gamma(k_1(i\Delta)) \\ \vdots \\ m_\gamma(k_K(i\Delta)) \end{pmatrix} = \begin{pmatrix} s_\gamma(r_0(i\Delta))e^{-jk'_0 r_0} & s_\gamma(r_1(i\Delta))e^{-jk'_0 r_1} & \cdots & s_\gamma(r_{N^2}(i\Delta))e^{-jk'_0 r_{N^2}} \\ s_\gamma(r_0(i\Delta))e^{-jk'_1 r_0} & s_\gamma(r_1(i\Delta))e^{-jk'_1 r_1} & \cdots & s_\gamma(r_{N^2}(i\Delta))e^{-jk'_1 r_{N^2}} \\ \vdots & \vdots & \ddots & \vdots \\ s_\gamma(r_0(i\Delta))e^{-jk'_K r_0} & s_\gamma(r_1(i\Delta))e^{-jk'_K r_1} & \cdots & s_\gamma(r_{N^2}(i\Delta))e^{-jk'_K r_{N^2}} \end{pmatrix} \begin{pmatrix} v(r_0) \\ v(r_1) \\ \vdots \\ v(r_{N^2}) \end{pmatrix} \quad (23)$$

$$= m_\gamma$$

$$= E_\gamma v$$

Due to its simplicity the combined iterative reconstruction is very attractive. The entire recon can be even performed without knowledge of the sampling density for pre-correction. The convergence is slightly slower, though. Further improvement can be made by preconditioning or Total Variation reconstruction.

Consider now multi-shot sequences which are useful for high-resolution diffusion-weighted imaging (DWI). A common problem encountered in multi-shot image acquisition is non-linear phase variation from shot to shot. This phase error is usually caused by patient motion during diffusion encoding periods. Typically this error is corrected for by subtracting a low resolution phase map from each shot. This phase map can be obtained either from an extra navigate image or from the k-space data of a self-navigated trajectory (e.g. variable density spirals). This simple algorithm can effectively remove the phase error if image reconstruction can be separated from phase correction. However, in many cases, these two processes cannot be separated; thus cannot be performed sequentially. For example, when each shot undersamples the k-space, effect of aliasing causes the phase error at one location appearing at other locations. The resulting non-localized phase error can no longer be corrected through a simple phase subtraction. Here, we present a method that performs phase correction simultaneously with image reconstruction. This novel method combines the conjugate gradient (CG) method with a least-square estimation of the image to be reconstructed. Successful phase correction is demonstrated for multi-shot DWI with self-navigated interleaved spirals (SNAILS).

Motion during diffusion encoding periods introduces phase errors that cause serious image degradation in multi-shot DWI. This extra phase can be incorporated into the image encoding function if treated as an additive perturbation term. Written in a matrix format, data acquired with a multi-shot sequence can be expressed as, $$m = Ev \quad (24)$$

Here, m is the k-space data stored in a column vector; v is the image space data stored in the same fashion; and E is the encoding matrix. The size of E is $N_k \times N^2$, where $N_k$ the total number of k-space sampling points and N is the image size. For the n-th shot, the elements of matrix E are $$E_{(k,n),\rho} = \exp(-ik_{k,n} r_\rho) p_n(r_\rho) \quad (25)$$

Here, $k_{k,n}$ is the k-th sampling point of the n-th shot, and $r_\rho$ is the p-th pixel of an image.

Two cases need to be considered in order to solve Eq. (24). First, if each shot samples k-space at or above the Nyquist rate (e.g. PROPELLER), then $p_n(r_\rho)m(r_\rho)$ can be easily computed for each shot separately using inverse Fourier transform. To take advantage of the fast Fourier transform (FFT) algorithm, a gridding procedure may be necessary if the sampling trajectory is non-Cartesian. Following an inverse FFT, the phase error $p_n(r_\rho)$ can be simply removed through a complex-number division. However, small residual artifacts will remain in the image because of the image domain convolution resulting from segmenting the k-space during data acquisition.

Second if each shot samples the k-space below the Nyquist rate (e.g. SNAILS), then $p_n(r_\rho)m(r_\rho)$ cannot be computed from each shot without suffering severe aliasing artifacts. Consequently, to reduce these artifacts, the matrix E that contains all the phase information has to be invested for both cases. This inversion can be effectively performed using a least-square estimation:

$$v = (E^H E)^{-1} E^H m \quad (26)$$

Typically E is a very large matrix. As a result, it is numerically impractical to estimate the image through direct matrix inversion and multiplication. However, this equation can be solved iteratively. For the efficiency of numerical evaluation, Eq. (26) can be rewritten as, $$(E^H E)v = E^H m \quad (27)$$

Various techniques have been developed to solve large systems of linear equations. Here, we apply the conjugate-gradient (CG) method by exploring the similarity between Eq (27) and the equation of sensitivity encoding (SENSE). We observe that Eq. (27) is equivalent to the SENSE reconstruction problem when $p_n(r_\rho)$ is treated as a pseudo "coil sensitivity" that varies from shot to shot.

Therefore, in the second case, to reconstruct an image from undersampled multi-shot diffusion data, we first estimate a low resolution phase map $p_n(r_\rho)$ for each shot. The right hand side of Eq. (27) is initially computed by directly removing the phase from each shot prior to summing all the data. During each iteration of CG, $(E^H E)m$ is calculated by using a combination of forward and backward gridding when the k-space trajectory is non-Cartesian (FIG. 1). Without loss of generality, other speed-up techniques such as the convolution-based SENSE can also be applied to calculate $(E^H E)v$.

In vivo diffusion-weighted images were acquired using SNAILS (3) on a GE Signal 1.5 T whole-body system. The parameters were: number of interleaf=28, FOV=22 cm, TR=2.5 s, TE=67 ms, and b=800 s/mm². Six diffusion-encoding directions were applied to measure the diffusion tensor. Low resolution phase maps were estimated using the center k-space data from each interleaf.

Figure 2:
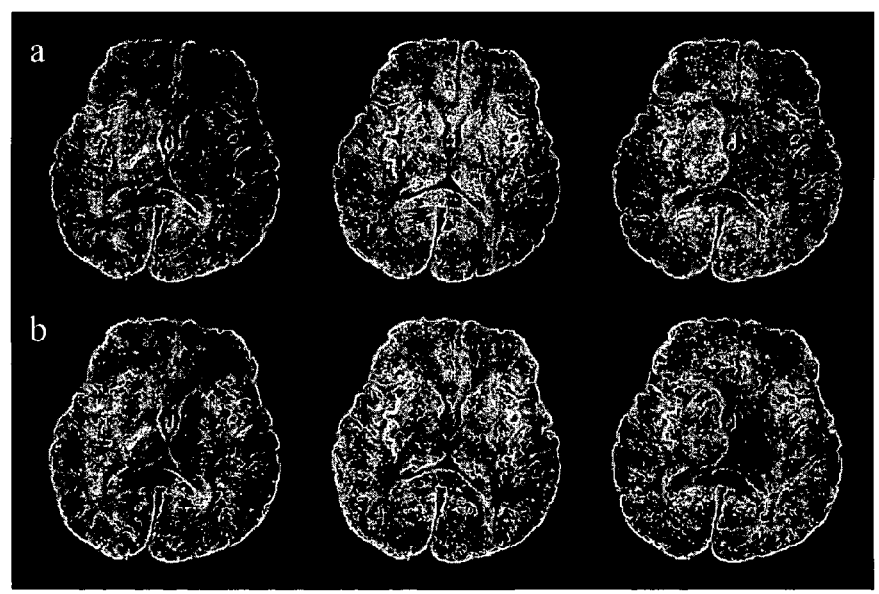
FIG. 2 illustrates estimated initial images and phase-connected images using the invention.

FIG. 2 shows estimated initial images and phase-corrected final images after 5 iterations. The initial images suffer from various degrees of signal cancellation because the motion-induced phase can not be completely subtracted from each interleaf. The signal loss is clearly restored in the corrected final images, resulting in a much higher signal to noise (SNR) ratio. FIG. 3 shows the computed fraction anisotropy (FA) map and color coded FA map.

We have established a mathematical framework for simultaneous image reconstruction and phase correction for multi-shot DWI. The image is computed iteratively using the CG method. In vivo experiments demonstrate that the signal cancellation caused by phase error can be successfully recovered using this algorithm (FIG. 2). Due to the enhanced SNR, the number of signal averages required for high resolution DTI can be reduced, thus improving the acquisition speed.

The problem of phase correction for multi-shot DWI was previously treated by Miller et al., MRM 2003; 50: 343-353. In their approach, Eq. (26) was simplified by assuming that $(E^H E)^{-1}$ was an identity matrix which was equivalent to treating the data as fully sampled. The method proposed in this abstract not only corrects for phase error of fully sampled data (e.g. PROPELLER) but also corrects for undersampled data (e.g. SNAILS). If each shot samples k-space at or above the Nyquist rate, this method reduces to the straightforward phase subtraction method. Such kind of sampling strategy and phase correction scheme are seen in PROPELLER DWI. However, if each shot undersamples k-space, the simple phase subtraction method cannot completely remove the phase error. In this case, Eq. (26) needs to be solved.

Iterative Reconstruction—Typically E is a very large matrix. As a result, it is numerically impractical to estimate the image through direct matrix inversion and multiplication. An approximate solution of m can be found by assuming that $(E^H E)^{-1}$ is an identity matrix, which yields the refocusing reconstruction proposed by Miller and Pauly. This approximation is also equivalent to the direct phase subtraction method employed in PROPELLER DWI.

The accuracy of the approximation method depends on the k-space sampling pattern and the amount of phase error. Nevertheless, given a k-space trajectory there is no guarantee that $(E^H E)^{-1}$ will be an identity matrix, because the motion-induced phase error fluctuates from shot to shot and from experiment to experiment. Since it is impractical to calculate $(E^H E)^{-1}$ via direct matrix inversion, Eq. (2) should be solved iteratively. To improve the efficiency of the numerical evaluation, Eq. (2) can be rewritten as $$(E^H E)v = E^H m. \tag{28}$$

Various techniques have been developed to solve large systems of linear equations. For this approach, we have applied the conjugate-gradient (CG) method. Notice that Eq. [8] is equivalent to the iterative SENSE reconstruction problem when the phase error prp) is treated as a pseudo "coil sensitivity" that varies from shot to shot; $p_\xi(r_\rho)$ is given by $$p_\xi(r_\rho) = e^{i\phi_\xi(r_{92})}. \tag{29}$$

When the k-space is non-uniformly sampled, a sampling density correction and intensity correction can be included in the computation as techniques for matrix preconditioning with the goal to reduce the number of iterations required for the CG method. The sampling density correction is performed by inserting a density matrix D in Eq. [8]:

$$(E^H D E)v = E^H D m. \tag{30}$$

Here, D represents a diagonal matrix with entries equal to the inverse of the relative density of the k-space sampling pattern at position $k_{k\xi}$. Intensity correction is not necessary for single-coil acquisition, but will be necessary for multi-coil acquisition as discussed in the following section.

To reconstruct an image, the right hand side of Eq. (30) is initially computed by directly removing the phase from each shot prior to summing all the data. During each iteration of CG. $(E^H DE)v$ is calculated using a combination of gridding and inverse gridding (FIG. 1) until the residual $\|(E^H E)v - E^H m\|$ converges to a minimum. Without loss of generality, the CG reconstruction can be accelerated further by realizing that $(E^H DE)$ is a transfer function that operates on the vectorized image data m and, thus, the forward and backward gridding can be replaced by a much faster convolution on a 2× grid.

Phase Correction and SENSE Reconstruction—By treating the phase error as a modulating function that is superimposed on the conventional image encoding function generated by the imaging gradient waveforms, we find that the mathematical formulation of the phase correction problem as shown in Eq. (28) is very similar to the SENSE reconstruction problem for arbitrary k-space acquisitions. Therefore, under the umbrella of the CG algorithm a combined reconstruction can be found for both phase-perturbed and undersampled k-space data. Specifically, for each shot or interleaf the data acquired by each coil can be considered to be encoded using a dynamic composite sensitivity profile that is the product of the coil sensitivity and the phase error. Denote $s_{\xi,\gamma}$ the composite sensitivity profile of the γ-th coil during the ξ-th shot, and $c_\gamma$ the coil sensitivity profile of the γ-th coil. The composite sensitivity $s_{\xi,\gamma}$ can be written as $$s_{\xi,\gamma}(r_\rho) = c_\gamma e^{i\phi_{\xi,\gamma}(r_\rho)}, \tag{31}$$

where $\phi_{\xi\gamma}$ is the phase error of the γ-th coil during the ξ-th shot in the image domain. With the definition of a composite sensitivity profile, the encoding matrix E can be defined accordingly. Specifically, each row of the matrix E contains the encoding functions for one k-space sampling point of one shot and for one coil, i.e., $$E_{(k,\xi,\gamma),\rho} = e^{-ik k_\xi \cdot r_\rho} s_{\xi,\gamma}(r_\rho). \tag{32}$$

Therefore, the size of E is $(n_k n_\xi n_\gamma) \times N^2$, where $n_\gamma$ is number of coils. Notice that if the complex exponential in Eq. (31) is zero, Eq. (31) would yield the generalized SENSE problem.

Determination of Phase Errors—For single-coil acquisition, image reconstruction for multi-shot DWI requires an accurate Knowledge of the motion-induced phase error. Because this phase error is usually random for in vivo studies, it has to be updated in real time for each shot. One method of measuring this phase error is to acquire a low-resolution navigator image separately prior to the diffusion-weighted image acquisition. Another method is to reconstruct a low-resolution phase map using the center portion of a self-navigated k-space readout trajectory. In this study, self-navigated trajectories, including both PROPELLER and SNAILS, are utilized because of their demonstrated ability to acquire high-resolution and high-quality diffusion-weighted images. However, the specific technique for determining phase errors $\phi_{\xi,\gamma}(r_\rho)$ is not critical for the phase correction algorithm introduced in this report.

Examples of PROPELLER and SNAILS trajectories are illustrated in FIG. 4a, 4b. Each blade of PROPELLER or each interleaf of SNAILS covers the center of the k-space at or above the Nyquist rate. The first step to measure the phase map from a self-navigated k-space trajectory is to select the center portion of the k-space that is fully sampled. To suppress Gibbs ringing in the low resolution phase map, the selected center portion is first multiplied by a Hamming window prior to FFT. The phase map is stored for each shot/interleaf and is used for phase correction during each CG iteration.

For multi-coil acquisition, not only the motion-induced phase error, but also the coil sensitivity ($^i$) is required to reconstruct an image. If the multi-shot readout trajectory is self-navigated, such as PROPELLER and SNAILS, then both the motion-induced phase error and the coil sensitivity profile can be measured simultaneously using the center portion of the k-space data. In this case, the low-resolution image reconstructed from those data serves one as an estimate of the composite sensitivity profile.

Materials and Methods—The iterative CG phase correction algorithm was applied to both simulated and in vivo data. Simulations were performed on PROPELLER and SNAILS readout trajectories, whereas in vivo data were acquired using SNAILS only due to the lack of capabilities to store raw data from PROPELLER. Multi-shot SNAILS DWI was also demonstrated in combination with parallel imaging using both simulated and in vivo data.

Simulations—For single-coil simulation, artificial MRI data were created from a zero-padded (up to 4×) resolution phantom scan (signal to noise ratio (SNR)=70) by using an inverse FFT and regridding along the desired k-space trajectories (e.g. PROPELLER blades, variable-density spirals). The gridding kernel was a two-dimensional three-term cosine window function with a window width of 4 pixels. The motion effect during diffusion encoding periods was simulated by adding a linear phase term in the phantom image prior to the FFT. This phase term was randomly generated for each shot so that it corresponds to a k-space shift uniformly distributed in the range of ±6 pixels (of a 256×256 image) in each dimension.

For multi-coil simulation, an 8-channel head coil (MRI Devices Corporation, Pewaukee, Wis.) was used. The sensitivity of each coil element was measured using a water phantom; the sensitivity was computed by dividing each coil image with the body-coil image (xii). To simulate the data acquisition for each coil during each shot, the resolution phantom image was multiplied by each coil's sensitivity. To simulate the motion-induced phase error, a random linear phase term was added to the image. The k-space data were then computed following the same procedure described in the single-coil simulation.

Single-coil simulation was performed using both PROPELLER and SNAILS trajectory, while, for simplicity, multi-coil simulation was only performed using SNAILS. The PROPELLER trajectory consisted of 28 blades. Each blade, which was uniformly sampled at the Nyquist rate, had 14 phase encoding lines. The SNAILS trajectory contained 23 interleaves of variable density (VD) spirals which had a pitch factor $\alpha$ of 4. Each spiral consisted of 3736 sampling points. To reconstruct the image from the simulated k-space data, the true phase error and coil sensitivity profile instead of estimated phase error and sensitivity were used in the reconstruction for the purpose of illustrating the accuracy of the CG phase correction algorithm itself.

Experiments—For single-coil acquisition, in vivo diffusion-weighted images were acquired using SNAILS on a 1.5T whole-body system (GE Signal, GE Healthcare, Waukesha, Wis.) equipped with a maximum gradient of 50 mT/m and a slew rate of 150 mT/m/s. A twice-refocused spin echo sequence was used to suppress gradient-induced eddy currents. The scan parameters were: FOV=22 cm, TR=2.5 s, TE=67 ms, bandwidth (BW)=125 kHz, and b=800 s/mm². The duration of the four diffusion gradients was: $\delta1=\delta3=8.4$ ms and $\delta2=\delta4=12.3$ ms. A total of 20 axial slices were prescribed with a 6.5 mm slice thickness and a zero gap in between. With an acquisition matrix size of 256×256, an in-plane resolution of 0.86×0.86 mm² was achieved. The VD spiral readout trajectory was the same as that used in the simulations (i.e. 23 interleaves, 3736 samples/interleaf, $\alpha=4$), which resulted in a readout time of 13.5 ms for each interleaf. Of the 3736 samples, the first 150 samples (that formed the center portion of the k-space) also contributed to the determination of the composite sensitivity profiles.

For multi-coil acquisition, in vivo diffusion-weighted images were acquired using the 8-channel head coil (MRI Devices Corporation, Pewaukee, Wis.). All sequence parameters were kept the same as for the single-coil acquisition. The reduction factor ranges from R=1 to 3.

Six diffusion-encoding directions were applied to measure the diffusion tensor. The six directions are $(1\ 1\ 0)^T$, $(0\ 1\ 1)^T$, $(1\ 0\ 1)^T$, $(1\ -1\ 0)^T$, $(0\ 1\ -1)^T$, and $(1\ 0\ -1)^T$. The scan time for acquiring six diffusion-weighted images plus an unweighted image was 6.7 minutes for coverage of the entire brain. For single-coil acquisition, this scan was repeated five times; for multi-coil acquisition, it was repeated twice.

All image reconstructions were performed using Matlab (Version 7, Release 14, The MathWorks, Inc.), running on a Windows PC equipped with a 3.06 GHz Pentium 4 CPU and 1.5 GB RAM.

Figure 5A:
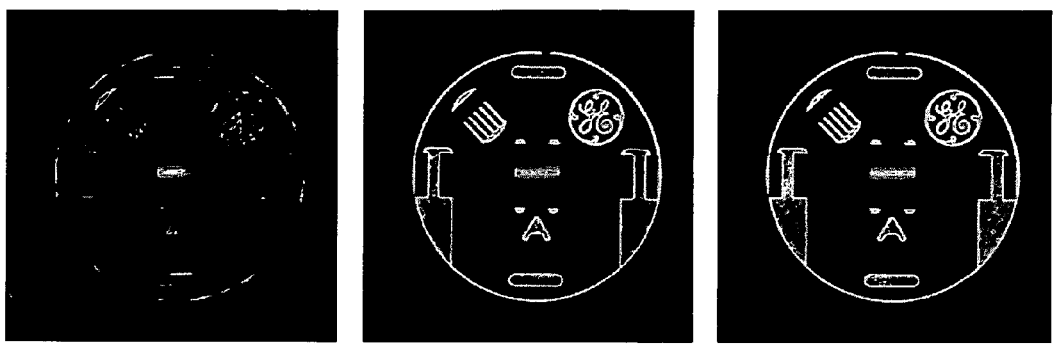
FIGS. 5a-5b illustrate effects of phase correction.
Figure 5B:
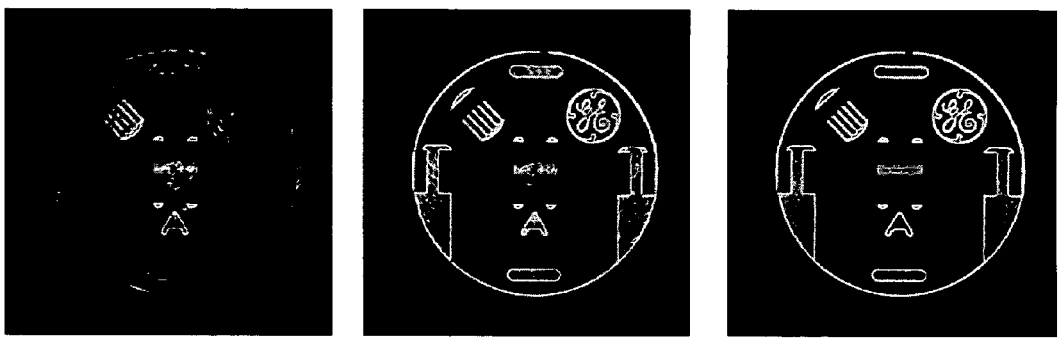

CG Phase Correction—FIGS. 5a-5b compare the simulated phantom images reconstructed with and without phase correction. FIG. 5a displays images reconstructed from the data simulated with the PROPELLER trajectory, whereas FIG. 5b demonstrates SNAILS images. From FIG. 3 it is apparent that images reconstructed without any phase correction are severely distorted. Although the same amount of motion was applied for both trajectories, the resulting distortion patterns are different. With the conventional phase subtraction method, the image quality is greatly improved for both trajectories but residual artifacts remain uncorrected in the image. For example, in the PROPELLER case, while the overall phantom structure has been restored, there are still some residual ghosting artifacts in the background of the image (middle image of FIG. 5a). In the SNAILS case, severe residual artifacts remain in various regions of the image especially in the middle of the phantom (middle image FIG. 5b). These residual artifacts are greatly reduced using the CG phase correction method. The final reconstructions shown in the right column of FIG. 5 are obtained after 6 CG iterations. The overall reconstruction time on our workstation was about 4 minutes using the CG algorithm with conventional forward and backward gridding, whereas it was reduced to 36 seconds when the gridding steps were replaced by the transfer function method (x,xi).

Figure 6A:
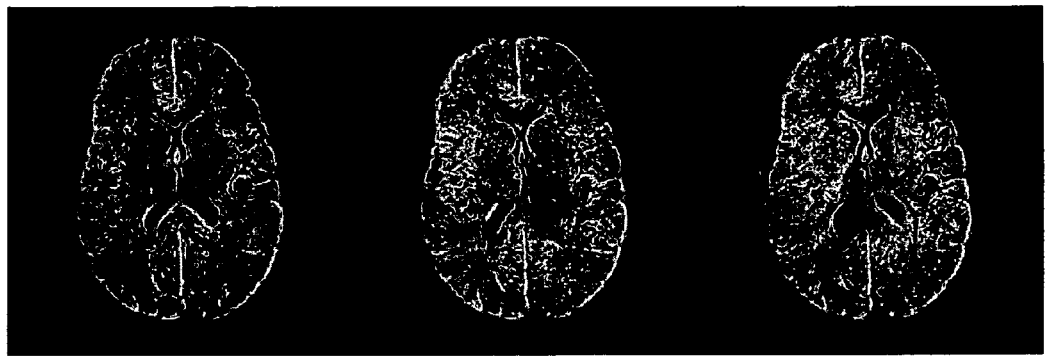
FIGS. 6a-6c show comparisons of phase correction methods.
Figure 6B:
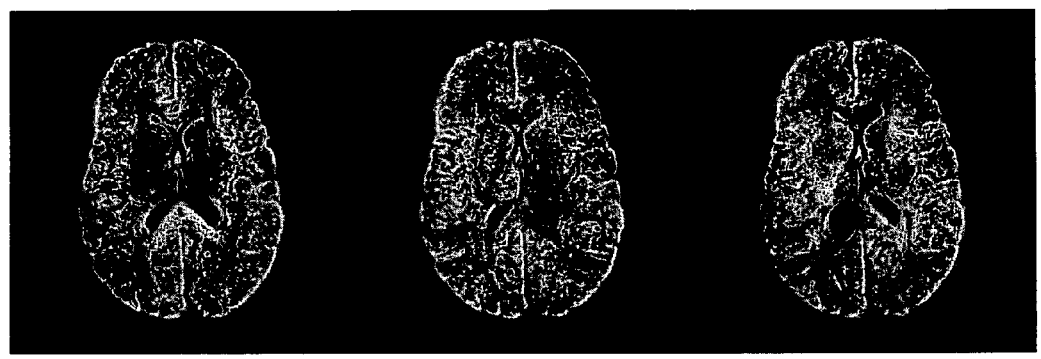
Figure 6C:

FIGS. 6a-6c compare a representative set of in vivo diffusion-weighted SNAILS images (R=1) reconstructed with either the subtraction or CG-based phase correction method. The figures show a comparison of two phase methods using in vivo diffusion-weighted images b=100 s/mm². Images are acquired with SNAILS. (a) Diffusion-weighted images reconstructed with the direct phase subtraction method; (b) with the CG phase correction method; (c) the image differences between (a) and (b). The three diffusion gradients, for left to right, are $(1\ 0-1)^T$, $(0\ 1-1)^T$ and $(1\ 1\ 0)^T$. Notice the enhanced contrast in the splenium of the corpus callosum for the CG method (first column). With the direct phase subtraction method, the background noise is relatively high (FIGS. 6a). As a result, the contrast of the image is relatively low. With the CG phase correction, the background noise is significantly reduced (FIG. 6b), and image contrast is restored (FIG. 7b). The contrast improvement is illustrated in the difference images (FIG. 6b and 7b). It appears that the image difference is more pronounced at regions of higher contrast, for example at the edge of the images and near the oriented white matter tracts.

Figure 7A:
FIGS. 7a-7c are comparisons of FA maps.
Figure 7B:
Figure 7C:

FIG. 7 compares the fractional anisotropy (FA) maps for the direct phase subtraction method (FIG. 7a) and the CG phase correction method (FIG. 7b). The differences between these two FA maps are shown in FIG. 7c. With the CG phase correction, the resultant FA maps have a lower noise level (FIG. 7b). For example, in the left-most column of FA maps, the standard deviation in the cortical gray matter is 0.04 with the CG method (FIG. 7b), compared to a standard deviation of 0.07 with the direction subtraction method (FIG. 7a). Furthermore, the CG phase correction method results in better defined whiter matter tracts. This improvement is especially significant in lower slices near the temporal lobe and the cerebellum, where motion artifacts are more severe (FIG. 7b).

Figure 8A:
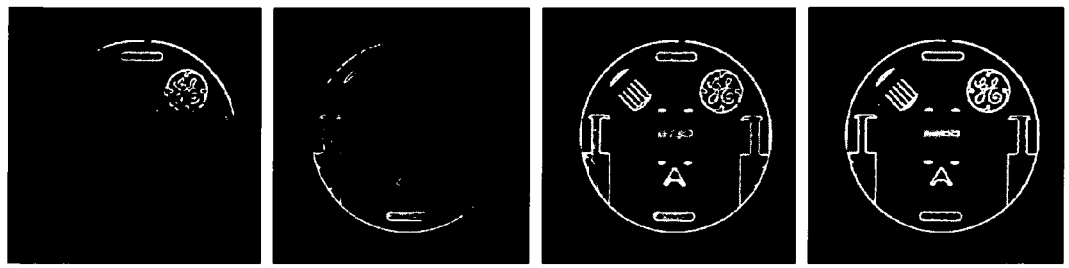
FIGS. 8a-8c are multi-shot SENSE DWI simulations.
Figure 8B:
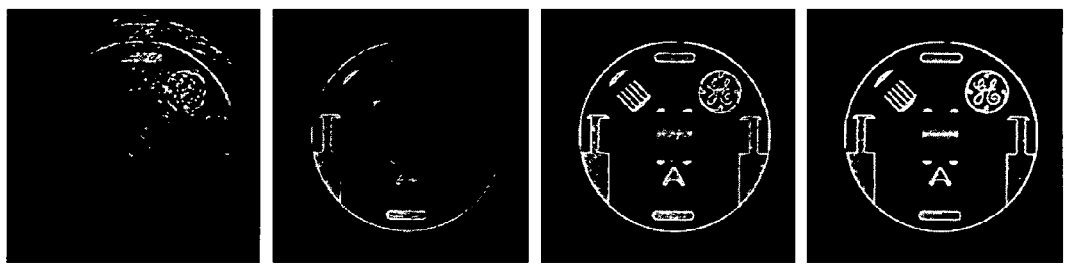
Figure 8C:
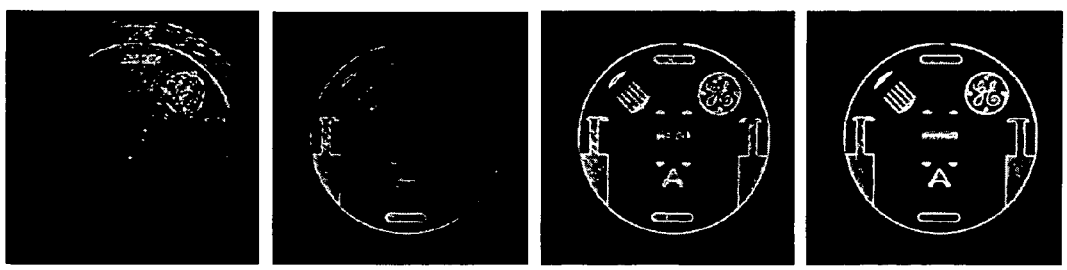

Phase Correction and SENSE Reconstruction—Multi-coil SNAILS data with random linear phase error were simulated using a SENSE reduction factor (xii) ranging from 1 to 3. The reconstructed images are displayed in FIG. 8. For each reduction factor, this figure shows a representative single coil image, the sum-of-squares image, the initial image, and the final reconstructed image. When the reduction factor equals 1, the final image is obtained after 6 iterations. The required number of iterations increases when the reduction factor increases. When the reduction factor equals 3, the reconstruction requires 20 iterations, which takes around 38 minutes with the gridding and inverse gridding method, and 5 minutes and 36 seconds with the transfer function method.

Figure 9A:
FIGS. 9a-9c illustrate multi-shot SENSE DTI using SNAILS trajectories for reduction factors of 1, 2, and 3, respectively.
Figure 9B:
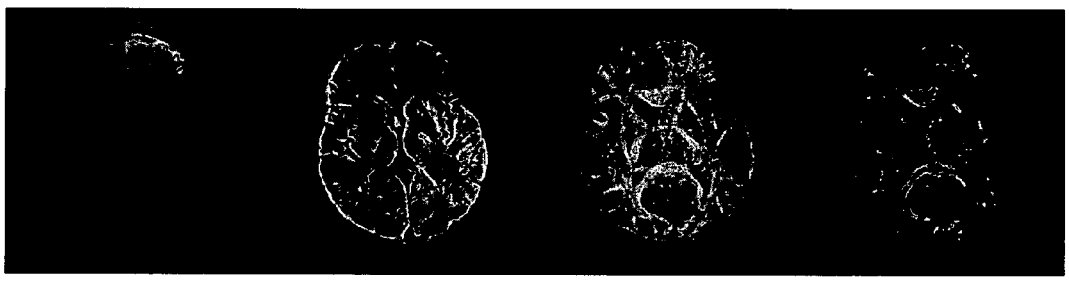
Figure 9C:

From the acquired in vivo multi-coil data, images are reconstructed with different SENSE reduction factors. To obtain an image with a reduction factor of 2, data from a total of 11 interleaves are used by skipping every other interleaf. To achieve a reduction factor of 3, 8 interleaves are used. The reconstructed images are shown in FIGS. 9a-9c for reduction factors of 1, 2, and 3, respectively. For each reduction factor. FIG. 9 displays a single coil image, the final image, and both the corresponding FA map and color coded FA map. Due to fewer measurements the noise level increases as expected with increasing reduction factors. However, the overall directionality information is preserved. From left to right, FIGS. 9a-9c show a typical single coil image, a typical final reconstructed diffusion: weighted image, the FA map and a corresponding color FA map.

We have established a mathematical framework of simultaneous phase correction and parallel imaging (SENSE) reconstruction for multi-shot DWI using arbitrary k-space trajectories. By treating the phase error as an additional modulation factor to the existing gradient and sensitivity encoding function, we can express the k-space data as a linear combination of the image-domain data. The resultant set of linear equations can be solved iteratively using the conjugate gradient method. Both simulations and in vivo experiments have demonstrated that the CG phase correction method can effectively reduce artifacts caused by motion-induced phase errors, and reconstruct diffusion-weighted images acquired with multiple coils using R=1 to 3.

CG Phase Correction—The problem of phase correction for multi-shot DWI was previously treated as a linear estimation problem by Miller and Pauly, supra. In that approach, Eq. (24) was simplified by approximating $(E^H E)^{-1}$ as an identity matrix, which resulted in the direct phase subtraction method. Miller and Pauly also showed that the accuracy of this approximation could be improved by averaging the data over multiple acquisitions, talking advantage of destructive interference of the residual aliasing. Using this direct phase subtraction method, some high-quality diffusion-weighted images were previously acquired with PROPELLER and navigated interleaved EPI techniques.

However, the direct phase subtraction method does not completely correct the effect of motion-induced phase errors due to image blurring or aliasing, as illustrated by our computer simulations. Specifically, for a segmented acquisition, such as PROPELLER, segmenting k-space results in a convolution in the image space, which causes the phase error of one pixel to appear in adjacent pixels. Consequently, the straightforward phase subtraction results in an incomplete phase correction and a relatively high background noise (FIG. 5a). For undersampled arbitrary k-space trajectories, such as SNAILS, the effect of aliasing causes the phase error at one location to appear at other locations. The resulting non-localized phase error can no longer be corrected through a direct phase subtraction. As a result, the residual artifacts include both high background noise and aliasing (FIG. 5b).

The CG phase correction method is a generalized phase correction technique for multi-shot DWI. It does not rely on specific readout trajectories, though certain trajectories might take advantages of this method more easily than others. Despite the fact that different k-space strategies result in different sensitivities to motion artifacts, the motion correction problem can be formulated in the same way and solved using the CG method. For example, the motion artifacts of PROPELLER DWI are mostly localized, which means that the distortion at one location is mainly caused by the interference of its neighboring structures (FIG. 5a). On the other hand, for the SNAILS trajectory or spiral trajectories in general, one local structure can distort the entire image due to the characteristic aliasing caused by undersampling the outer k-space during each shot (FIG. 5b). Nevertheless, the CG phase correction method works for both sampling trajectories. The generality of this phase correction method is similar to the fact that the SENSE algorithm is suitable for arbitrary k-space trajectories of any type, e.g. Cartesian, spiral, or radial sampling.

Accurate phase correction and SENSE reconstruction relies on an accurate knowledge of phase errors and the coil sensitivity profiles. Because the phase errors change from shot to shot, it has to be measured for each shot. If the subject motion is small, the low resolution phase error in the spatial domain can be estimated accurately using the center k-space data. However, if the phase error contains rapidly varying components, a low-resolution phase map will not be sufficient. As a result, there will be residual artifacts in the image even after phase correction. Other techniques that have been developed to alleviate the problem of inaccurate sensitivity profiles can be also applied here.

Multi-Shot SENSE DWI—Besides using multi-shot sequences, another approach for high resolution DWI is to combine parallel imaging with single-shot EPI. However, there have been no reported attempts to combine parallel imaging techniques with multi-shot DWI. One difficulty for multi-shot SENSE DWI is performing phase correction on data modulated by both coil sensitivity and motion-induced phase error. For single-shot acquisitions, the motion-induced phase error $p(r_\rho)$ is a common factor for all coils, thus can be absorbed into the vector m and neglected in the image reconstruction, if one only cares about the magnitude of the image. However, for multi-shot acquisitions, even if the sensitivity profile of each coil might be stable during the experiment, motion-induced phase errors vary from shot to shot and cannot be ignored.

By treating the phase error as an additional image encoding function, we find that the phase error and the coil sensitivity can be combined to form a composite sensitivity profile for each receiver coil element. With this treatment. Phase correction and SENSE reconstruction can be formulated in the same set of linear equations, which can be solved iteratively with the CG method. The feasibility of simultaneous phase correction and SENSE reconstruction has been demonstrated with both simulation (FIG. 7) and in vivo scans (FIG. 9). Although the simulation and in vivo studies have been performed using SNAILS only, the proposed algorithm works for other navigated multi-shot DWI sequences, such as PROPELLER and navigated multi-shot EPI, as well. Although combining SENSE reconstruction and phase-navigation has facilitated multi-shot SENSE DWI scans, this method is not precluded from application to other methods, such as functional MRI (fMRI) or perfusion-weighted imaging (PWI), where phase errors can also cause problems. Ultimately, it should be noted that the phase and sensitivity measurement can be either included into the imaging trajectory or acquired as a separate navigator echo, providing that consistent phase and sensitivity information can be extracted from the imaging or the navigator echo.

The proposed reconstruction method for multi-shot SENSE DWI is computationally demanding, especially when using the forward and backward gridding. The forward and backward gridding procedure has to be performed independently for each interleaf and for each coil element. There are typically many interleaves for high resolution acquisitions: for example, SNAILS requires 23 interleaves to fully sample an image of 256×256 pixels. With increasing number of receiver coils the reconstruction becomes increasingly demanding. When an 8-channel receiver coil is used, for example, this gridding procedure has to be performed 184 times for each CG iteration (FIG. 1). Although the number of interleaves reduces with a higher reduction factor, the algorithm converges slower. Consequently, when using higher reduction factors, the reconstruction generally takes longer. Conversely, with increasing reduction factors the number of sample points decreases relative to a full k-spatce acquisition and saves some data acquisition time. In addition, we have demonstrated that the computation time can be dramatically shortened when using the transfer function method. The reconstruction can be further accelerated with a more optimal software implementation and parallel computation, as pointed out by earlier authors.

One drawback of multi-shot DWT sequences has been the increase of scan time. The scan-time penalty is a result of the fundamental tradeoff between resolution and SNR. The proposed multi-shot SENSE technique facilitates the application of parallel imaging in multi-shot DWI and therefore reduces the minimum scan time required. As demonstrated by the in vivo experiments, using a reduction factor of 2, a whole-brain diffusion tensor imaging (DTI) study with a resolution of 256×256 can be performed in less than 7 minutes. The resultant images exhibit good quality. Another benefit of parallel imaging with multi-shot DWI, for example SNAILS, is the capability of reducing off-resonance blurring. With a reduction factor of 2, the readout time can be shortened by prescribing more interleaves; therefore image blurring caused by off-resonant spinis can be reduced.

By treating the motion-induced phase error as an additional image encoding function, the phase correction problem can be formulated as a set of linear equations. This set of equations can be solved iteratively using the CG method. Simulations and in vivo studies have shown that this method can significantly reduce the residual artifacts resulting from the direct phase subtraction method. Furthermore, because its similarity to sensitivity encoding, the motion-induced phase error can be incorporated into the SENSE reconstruction by defining a dynamic composite sensitivity profile. This simultaneous phase correction and SENSE reconstruction allows for high resolution multi-shot SENSE DWI.

While the invention has been described with reference to specific embodiments, the description is illustrative of the invention and not limiting the invention. Various applications and modifications may occur to those skilled in the art without departing from the true spirit and scope of the invention as defined by the appended claims.

What is claimed is:

1. A method of magnetic resonance imaging reconstruction with phase error correction comprising the steps of:
    a) Obtaining data for a plurality of k-space trajectories using a plurality of receiver coils, each with a specific coil phase,
    b) Defining data in terms of coil sensitivity and position vectors,
    c) Modifying the coil sensitivities for each coil in step (b) to include a time invariant and time variant phase perturbation caused by (i) motion during diffusion encoding, and (ii) at off resonance blurring, and
    d) Iteratively reconstructing the data to form image data for image reconstruction by employing an iterative conjugate gradient reconstruction.

2. The method, as defined by claim 1, wherein the iterative conjugate gradient reconstruction, comprises the steps of:
    reformulating a reconstruction problem into: $(E^H E)v = E^H m$, where
    v is a voxel matrix, E is an image encoding matrix comprising the modified coil sensitivities and a discrete Fourier Transform, and m is a vector containing the acquired k-space sampling data;
    precomputing $E^H m$ once;
    initialize $v^{(0)}$; and
    solving for v iteratively by computing $(E^H E)v^{(n)}$, where n indicates an iteration step, so that v converges to a solution that minimizes a norm $\|(E^H E)v^{(n)} - E^H m\|$.

3. The method as defined by claim 1 wherein step (d) utilizes a Hermetian matrix.

4. The method as defined by claim 1 wherein step (a) employs variable-density spiral acquisitions from which navigator phase and coil sensitivity are acquired.

5. The method as defined by claim 1 wherein data obtained in step (a) is expressed as $$m(k_l) = \sum_{\rho=1}^{N*N} s_\gamma(r_\rho) v(r_\rho) e^{-jk_l r_\rho}$$

where
    $s_\gamma$=coil sensitivity
    $r_{(\rho)}$=position vector
    V=voxel
    $e^{-jk_l \rho}$=image coding.

6. The method as defined by claim 5 wherein step (c) includes in the step (a) expression of data a term $p(r_\rho)$ for time invariant phase, but variable between RF excitation/diffusion-encoding, whereby the expression for data, for each interleave, becomes $$m(k_l) = \sum_{\rho=1}^{N*N} s_\gamma(r_\rho) p(r_\rho) v(r_\rho) e^{-jk_l r_\rho}$$

7. The method as defined by claim 6 wherein step (d) includes in the step (a) expression of data a term $o(r_\rho(i\Delta t))$ for time variant phase whereby the expression for data becomes $$m(k_{l(i\Delta t)}) = \sum_{\rho=1}^{N*N} s_\gamma(r_\rho) o(r_\rho(i\Delta t)) v(r_\rho) e^{-jk_l r_\rho}$$

8. The method of claim 7 wherein the time invariant phase and the time variant phase become part of an augmented sensitivity and the expression for data becomes $$\tilde{s}_\gamma(r_\rho(i\Delta t)) = s_\gamma(r_\rho) p(r_\rho) o(r_\rho(i\Delta t)).$$

9. The method as defined by claim 8 wherein step (a) employs diffusion-weighted imaging with multi-shot image acquisition.

10. The method as defined by claim 1 wherein step (a) employs diffusion-weighted imaging with multi-shot image acquisition.

11. The method as defined in claim 1, wherein the time variant phase perturbation is also spatially variable and wherein the motion during diffusion encoding varies between interleaves, blades, and k-space lines following each RF excitation and diffusion encoding step, and wherein the off resonance blurring continuously accrues a phase angle during each interleaf and blade and k-space line, and wherein the conjugate gradient reconstruction is linear and non-linear.

12. The method, as defined by claim 1, wherein the iterative conjugate gradient reconstruction, comprises the steps of:
   reformulating a reconstruction problem into: $(E^H E)v = E^H m$, where
   v is a voxel matix, E is an image encoding matrix comprising the modified coil sensitivities and a discrete Fourier Transform, and m is a vector containing the acquired k-space sampling data;
   precomputing $E^H m$ once;
   initialize $v^{(0)}$; and
   solving for v iteratively by computing $(E^H E)v^{(n)}$, where n indicates an iteration step, so that v converges to a solution that minimizes a norm $\|(E^H E)v^{(n)} - E^H m\|$.

13. The method as defined by claim 12, wherein data obtained in step (a) is expressed as $$m(k_{l(i\Delta t)}) = \sum_{\rho=1}^{N*N} s_\gamma(r_\rho) o(r_\rho(i\Delta t)) v(r_\rho) e^{-jk_l r_\rho}$$

where
   $s_\gamma$ = coil sensitivity
   $o(r_\rho(i\Delta t))$ = off-resonance phase
   $r_{(\rho)}$ = position vector
   v = voxel.

14. The method as defined by claim 13 wherein step (c) includes in the step (a) expression of data a term $p(r_\rho)$ for time invariant phase, but variable between RF excitation/diffusion-encoding, whereby the expression for data, for each interleave, becomes $$m(k_l) = \sum_{\rho=1}^{N*N} s_\gamma(r_\rho) p(r_\rho) v(r_\rho) e^{-jk_l r_\rho}$$

15. The method as defined by claim 14 wherein step (d) includes in the step (a) expression of data a term $o(r_\rho(i\Delta t))$ for time variant phase whereby the expression for data becomes $$m(k_{l(i\Delta t)}) = \sum_{\rho=1}^{N*N} s_\gamma(r_\rho) o(r_\rho(i\Delta t)) v(r_\rho) e^{-jk_l r_\rho}$$

16. The method of claim 15 wherein the time invariant phase and the time variant phase become part of an augmented sensitivity and the expression for data becomes $$\tilde{s}_\gamma(r_\rho(i\Delta t)) = s_\gamma(r_\rho) p(r_\rho) o(r_\rho(i\Delta t)).$$

17. The method as defined by claim 16 wherein step (a) employs diffusion-weighted imaging with multi-shot image acquisition.

18. A method of magnetic resonance imaging reconstruction with phase error correction comprising the steps of:
   a. Obtaining data for a plurality of k-space trajectories using a plurality of receiver coils, each with a specific coil magnitude and phase,
   b. Defining data in terms of coil sensitivity and position vectors,
   c. Modifying the coil sensitivities for each coil in step (b) to include a time variant spatially variable phase perturbation caused by (i) motion during diffusion encoding, which varies between interleaves, blades, and k-space lines following each RF excitation or diffusion step, and (ii) spins at off-resonance, which continuously accrue a phase angle during each interface, blade, and k-line, and
   d. Iteratively reconstructing the data to form image data for image reconstruction by employing an iterative conjugate gradient reconstruction or similar algorithms for large matrix systems.

* * * * *

UNITED STATES PATENT AND TRADEMARK OFFICE
CERTIFICATE OF CORRECTION

| | | |
|---|---|---|
| PATENT NO. | : 7,408,345 B2 | Page 1 of 1 |
| APPLICATION NO. | : 11/348852 | |
| DATED | : August 5, 2008 | |
| INVENTOR(S) | : Bammer et al. | |

It is certified that error appears in the above-identified patent and that said Letters Patent is hereby corrected as shown below:

In the Specification:

Please replace Column 1, Line No. 5-7 with

--This invention was made with Government support under contract EB002711 awarded by the National Institutes of Health. The Government has certain rights in the invention.--

Signed and Sealed this
Twenty-sixth Day of April, 2016

Michelle K. Lee
*Director of the United States Patent and Trademark Office*